United States Patent
Doig et al.

(10) Patent No.: US 6,529,913 B1
(45) Date of Patent: Mar. 4, 2003

(54) DATABASE FOR ELECTRONIC DESIGN AUTOMATION APPLICATIONS

(75) Inventors: Robert C. Doig, Campbell, CA (US); Louis K. Scheffer, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 126 days.

(21) Appl. No.: 09/689,167

(22) Filed: Oct. 11, 2000

Related U.S. Application Data

(60) Provisional application No. 60/159,811, filed on Oct. 15, 1999.

(51) Int. Cl.[7] .................................................. G06F 17/30
(52) U.S. Cl. ........................................ 707/101; 716/11
(58) Field of Search ............................. 707/1, 2, 4, 10, 707/101, 102; 716/11

(56) References Cited

U.S. PATENT DOCUMENTS

| | | | |
|---|---|---|---|
| 5,247,666 A | | 9/1993 | Buckwold .................... 707/100 |
| 5,267,175 A | | 11/1993 | Hooper ......................... 716/18 |
| 5,418,961 A | * | 5/1995 | Segal et al. ..................... 707/1 |
| 5,487,018 A | * | 1/1996 | Loos et al. .................... 716/11 |
| 5,519,628 A | | 5/1996 | Russell et al. ................. 716/10 |
| 5,761,664 A | | 6/1998 | Sayah et al. ................. 707/100 |
| 5,838,583 A | | 11/1998 | Varadarajan et al. ............ 716/9 |
| 5,864,838 A | | 1/1999 | Rusterholz .................. 707/101 |
| 5,883,811 A | | 3/1999 | Lam ............................... 716/6 |
| 6,135,647 A | * | 10/2000 | Balakrishnan et al. ......... 716/18 |
| 6,152,612 A | * | 11/2000 | Liao et al. .................... 703/15 |
| 6,360,350 B1 | * | 3/2002 | Gabele et al. ................. 716/1 |

* cited by examiner

*Primary Examiner*—Diane D. Mizrahi
*Assistant Examiner*—Yicun Wu
(74) *Attorney, Agent, or Firm*—Bingham McCutchen LLP

(57) ABSTRACT

A database for storing chip design information comprises a plurality of parallel arrays for storing a particular class of information. The union of related entries commencing at a given array index across the one or more parallel arrays of a particular class forms a structure for a given instance within a class. Between classes, individual records in an array may cross-reference, through an array index, records in other arrays. The inherent sequential nature of records stored in the array may be used as linking information, thus avoiding the requirement of storing linking pointers in memory. Rather than storing all of the coordinate or spatial information for a given shape, only the offset information from the preceding shape may be stored, with the assumption that the second shape starts at the ending point of the first shape. Certain default values or characteristics for information within the array records can be assumed unless overridden by an indicator in the array record. Allocation of storage space for data entries may be adaptively managed based on the size of the data to be stored, with allocation size being determined by the largest value of the stored entries, or a header code for the data entry indicating the number of bytes. The data header of each class may include a pointer indicating the position in memory of a main data header, which in turn contains pointers to the positions in memory of the other classes, allowing instances in a class to refer to related instances in the other classes through an integer index number without requiring the use of other pointers.

51 Claims, 8 Drawing Sheets

DATABASE FOR ELECTRONIC DESIGN AUTOMATION APPLICATIONS

RELATED APPLICATION DATA

This application is a continuing application of U.S. Provisional Application Serial No. 60/159,811, filed on Oct. 15, 1999, hereby incorporated by reference as if set forth fully herein.

BACKGROUND OF THE INVENTION

1) Field of the Invention

The field of the present invention relates to electronic design automation for chip design and, more particularly, to computer-implemented methods, systems and/or products for database construction and management useful for electronic design automation applications.

2) Background

Chip designers often use electronic design automation (EDA) software tools to speed up the design process and to allow simulation of a chip design prior to prototyping or production. Chip design using EDA software tools generally involves an iterative process whereby the chip design is gradually perfected. In a typical chip design process using EDA software tools, the chip designer builds up a circuit by inputting information at a computer workstation generally having high quality graphics capability so as to display portions of the circuit design as needed. A top-down design methodology is usually employed using hardware description languages (HDLs), such as Verilog® or VHDL, for example, by which the designer creates an integrated circuit by hierarchically defining functional components of the circuit, and then decomposing each component into smaller and smaller components.

Two of the primary types of components used in integrated circuits are datapaths and control logic. Control logic, typically random logic, is used to control the operations of datapaths. Datapath areas of the circuit perform functional operations, such as mathematical or other operations. More particularly, datapaths are typically composed of large numbers of highly regular and structured datapath functions, each such function typically including an arrangement of logic cells. In large integrated circuit designs, the number of logic cells can be enormous—on the order of millions. The logic cells, and the information relating to them, is kept track of using a very large database.

The various components of an integrated circuit are initially defined by their functional operations and relevant inputs and outputs. The designer may also provide basic organizational information about the placement of components in the circuit using floorplanning tools. During these design states, the designer generally structures the circuit using considerable hierarchical information, and has typically provided substantial regularity in the design.

From the HDL description, the actual logic cell implementation is typically determined by logic synthesis, which converts the functional description of the circuit into a specific circuit implementation. The logic cells are then placed (i.e., given specific coordinate locations in the circuit layout) and routed (i.e., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity.

Further explanation of a particular chip design process, with particular emphasis on placement and routing of datapaths, is set forth, for example, in U.S. Pat. No. 5,838,583, hereby incorporated by reference as if set forth fully herein.

While EDA software tools provide substantial assistance to chip designers, the demands on such software tools has dramatically increased over the years as the number of components that can be fit on a single microchip has likewise increased. One aspect of such software tools that has particularly been strained is the database that is required to keep track of all of the myriad components and connections used in a chip design. The database is needed to store, among other things, the type and content of each cell (known as instances), its connections to other cells, and its location within the chip layout. Where hundreds of thousands, or millions, of cells are required for a given integrated circuit design, the database for storing such information can become quite large.

One conventional way of implementing a database for storing chip design information is to create a series of individually allocated chunks of memory, referred to as "beads", and to link these beads dynamically with pointers. Such a database design is convenient from the standpoint of ease of varying the number of elements, since adding new elements simply involves adding more records to a linked list (or circular list) of like records. However, pointer list database designs have several drawbacks. A major disadvantage is that pointers take up a great deal of memory space. Since pointers are generally required to reach any point in working memory, for large working memories the pointers need to be relatively long. Currently, pointers are often four bytes (32 bits) in length. Where millions of cells are present in a chip design, cross-referencing information through pointers therefore can consume huge amounts of memory.

An additional disadvantage of pointer list databases is that they can take a long time to read into working memory. This problem arises because when the database is stored on a disk (or other permanent storage medium), the pointer values are not recorded since they will have different values each time the data is read in from the disk. Thus, when the database is read from the disk into working memory space, pointer values need to be assigned. The assignment of pointer values upon being read is known as pointer set-up, and the account of time needed for carrying out this process can be quite long for large databases. Where numerous design changes are made, which is a frequent occurrence with large, complicated chip designs, the pointer set-up time is endured each time the database is read from disk, which can greatly slow down the design process.

Yet another disadvantage with pointer list databases in EDA applications is that temporary data associated with a particular bead cannot easily be accessed unless space is permanently allocated within the bead. To provide for such temporary data storage and manipulation, a single generic work field, which the programmer is generally allowed to use for any purpose, is often allocated in the bead. Usually, the generic work field is used for a pointer to additional data. To provide many or all records with a generic work field generally requires setting aside a large amount of storage space, many of which may go unused and therefore be wasteful.

Since data is accessed by pointer lists, it is possible to end up with completely isolated chunks of memory, which are impossible to access using the pointer lists. This situation leads to inefficient use of memory resources.

Another disadvantage of pointer list databases is that this format as stored on the disk is usually different from their in-memory format (i.e., after the database is read in to working memory). The data beads are generally read into working memory in bits and pieces, or else they can be read in singly. In the latter case, backward compatibility with older versions of the database becomes a nuisance and inevitably slows down the read process. In addition, substantial care must be taken at the design stage, since it is often difficult to add extra pointers and data fields after the database design has been set.

Another type of conventional database is based on a series of records stored sequentially in an array. However, array-based databases for storing chip design data have not been utilized extensively in electronic design automation applications. One possible reason for the unpopularity of array-based databases in chip design applications is that such databases are commonly viewed as inefficient for handling large aggregates of data. Typically, the same amount of memory space must be allocated in advance for each record, yet the amount of data within each record can vary widely. From a programming standpoint, it can be unwieldy to handle data stored in an array-based database. Furthermore, dynamic size changes to an array-based database structure are difficult. Another drawback is that there is difficulty inserting new records anywhere but the end of the array.

It would therefore be advantageous to provide a database especially suited for chip design applications, which overcomes one or more of the foregoing problems.

SUMMARY OF THE INVENTION

The present invention relates to computer-implemented methods, systems and/or products for providing a database particularly useful for electronic design automation applications.

In one embodiment as described herein, a database for storing chip design information comprises a plurality of parallel arrays. One or more parallel arrays are used for storing a particular class of information. In this context, a class is an abstract data type comprising a collection of data, such as integers or characters, possibly in connection with a set of special functions (member functions) for operating on the collection of data. For many chip designs, there may be a hundred or more classes of information. The union of related entries commencing at a given array index across the one or more parallel arrays of a particular class forms the structure for a given instance within a class. Between classes, individual records in an array may cross-reference, through an array index, records in other arrays. For example, the database may include an array of port records in one class and a separate array of associated net records in another class, wherein each port record refers to the net assigned to it by an index number into the array of net records. A union of entries across classes that are cross-referenced together with array indexes may form a complete structure for a cell instance or other type of system component.

Due to the general absence of pointers, and the use of array indexes in their stead, large savings of memory are possible. Also, the version of the database as stored on disk or in other permanent storage medium can be almost exactly the same as the version stored in working memory (i.e., the "in-memory" version). Another advantage of the array-based database structures described herein is that the record arrays can be written to disk and read from disk with a single operating system call for each array, providing increased speed of performance. Moreover, since each record set is of a known size, it is possible to quickly step over those arrays which are not needed, making read-on-demand capability relatively easy to implement.

Further memory savings and speed advantages may be obtained in other embodiments of the invention, wherein the inherent sequential nature of records stored in the array is used as linking information, thus avoiding the requirement of storing such information in memory. For example, the ports on a cell can be assumed to be in the same order as the port definitions on the corresponding cell master. As a result, a cross-referencing index from the port instance array to the port master array need only be provided to the first entry in each array, and it can be assumed that each subsequent port instance or port definition follows sequentially for the given cell.

Another technique for saving memory space is to avoid storing all of the coordinate or spatial information for a given shape, but rather to store only the offset information from the preceding shape. In one embodiment, an assumption is made that the second shape starts at the ending point of the first shape. The system can also provide certain default values or characteristics for information within the array records, with the default values being used unless overridden by an indicator in the array record. Since little or no information needs to be stored where the default values are used, memory storage requirements can be substantially reduced.

As another technique for conserving memory in connection with the usage of parallel arrays as described above, the one or more parallel arrays within a given class may adaptively allocate storage space for data entries based on the size of the data to be stored. In a particular embodiment, from one to four bytes of data (or a "null" designator) may be adaptively allocated for storing data entries. The selection of allocation size may be determined by the largest value of the stored entries. The resulting array structure may be referred to as an intelligent integer array. Alternatively, one of the one or more parallel arrays in a given class may be a "bytestream" encoded array, wherein a header code for a given data entry within the bytestream encoded array indicates the number of bytes following the header code for that data entry.

In a particular embodiment as disclosed herein, in which the above parallel array techniques are utilized, a database head comprises a set of pointers to a plurality of memory blocks (i.e., beads), each of which comprises a plurality of records in the form of one or more parallel arrays. Several databases may be stored in working memory at the same time, and a separate database head may be provided for each database. The database heads themselves may be connected to one another through pointers in a linked list.

In a preferred embodiment, each class has a data header with a field indicating the number of indexes allocated for each of the one or more parallel arrays and another field indicating the actual number of indices used within the one or more parallel arrays. In addition, the data header of a given class preferably includes a pointer indicating the position in memory of a main data header. Because the main data header in turn has a pointer to the position in memory of the other classes, instances in the given class may refer to related instances in the other classes through an integer index number without requiring the use of other pointers.

Further embodiments, variations and enhancements are also described herein or shown in the accompanying drawings.

DETAILED DESCRIPTION OF PREFERRED EMBODIMENTS

Figure 1:
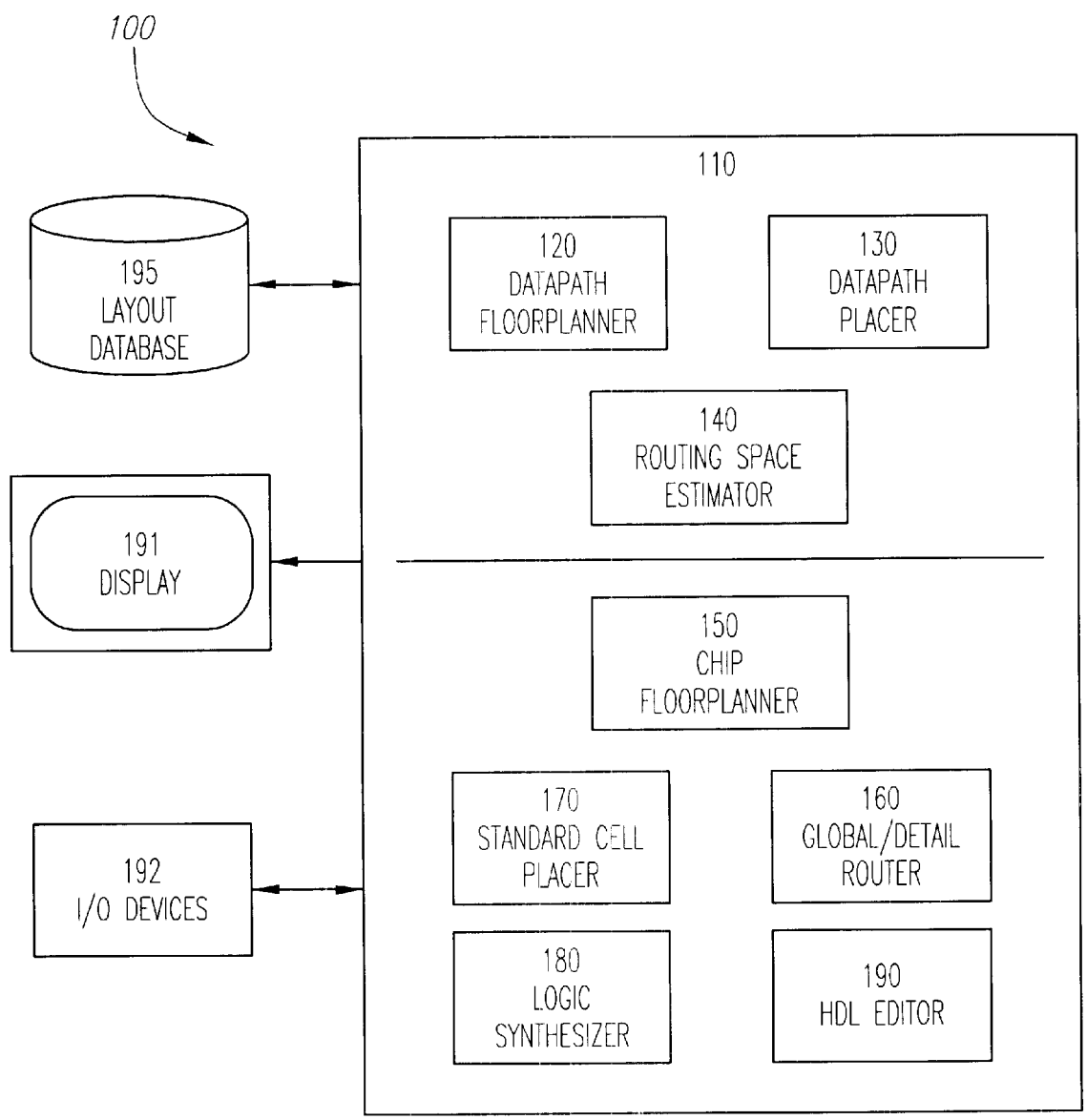
FIG. 1 is a diagram of a computer system in which a layout database in accordance with the present invention may be usefully employed.

FIG. 1 is a diagram of a computer system that may be used in connection with various embodiments of the invention as described herein. As shown in FIG. 1, a computer system 100 includes a computer 110 connected to a display 191 and various input-output devices 192. The computer may comprise one or more processors (not shown), as well as working memory (e.g., RAM) in an amount sufficient to satisfy the speed and processing requirements of the system. The computer may comprise, for example, a SPARC® workstation commercially available from Sun Computers, Inc. of Santa Clara, Calif., or any other suitable computer.

The computer 110 contains stored program code including, in one embodiment, a datapath floorplanner 120, a datapath placer 130 and a routing space estimator 140. The datapath flooplanner 120 provides for the definition of datapath functions, datapath regions, and constraints on these for the purpose of interactive floorplanning operations by the circuit designer, and the control of placement operations of the datapath placer 130. The datapath placer 130 determines the placement of datapath functions within datapath regions, and the placement of logic cell instances within each datapath function, according to the constraints defined by the circuit designer. The routing space estimator 140 estimates routing space required for routing the datapath functions, given the placement of such functions by the datapath placer 130.

In support of the above-mentioned system components, a chip floorplanner 150, global/detail router 160, standard cell placer 170, logic synthesizer 180, and HDL editor 190 may be usefully employed. Operation of the chip floorplanner 150, global/detail router 160, standard cell placer 170, logic synthesizer 180, and HDL editor 190 is conventional, as the design of these components is well known in the art of electronic design automation. Examples of these system components are Preview, Cell3, QPlace, Synergy, and Verilog, respectively.

The computer 110 is coupled to a storage device (e.g., magnetic disk or cartridge storage) providing a layout database 195 with which the foregoing system components interface. The layout database 195 may be implemented using the EDIF database standard. Details of a preferred format of the layout database 195, and methods of storing information in connection therewith, are provided later herein.

Figure 2:
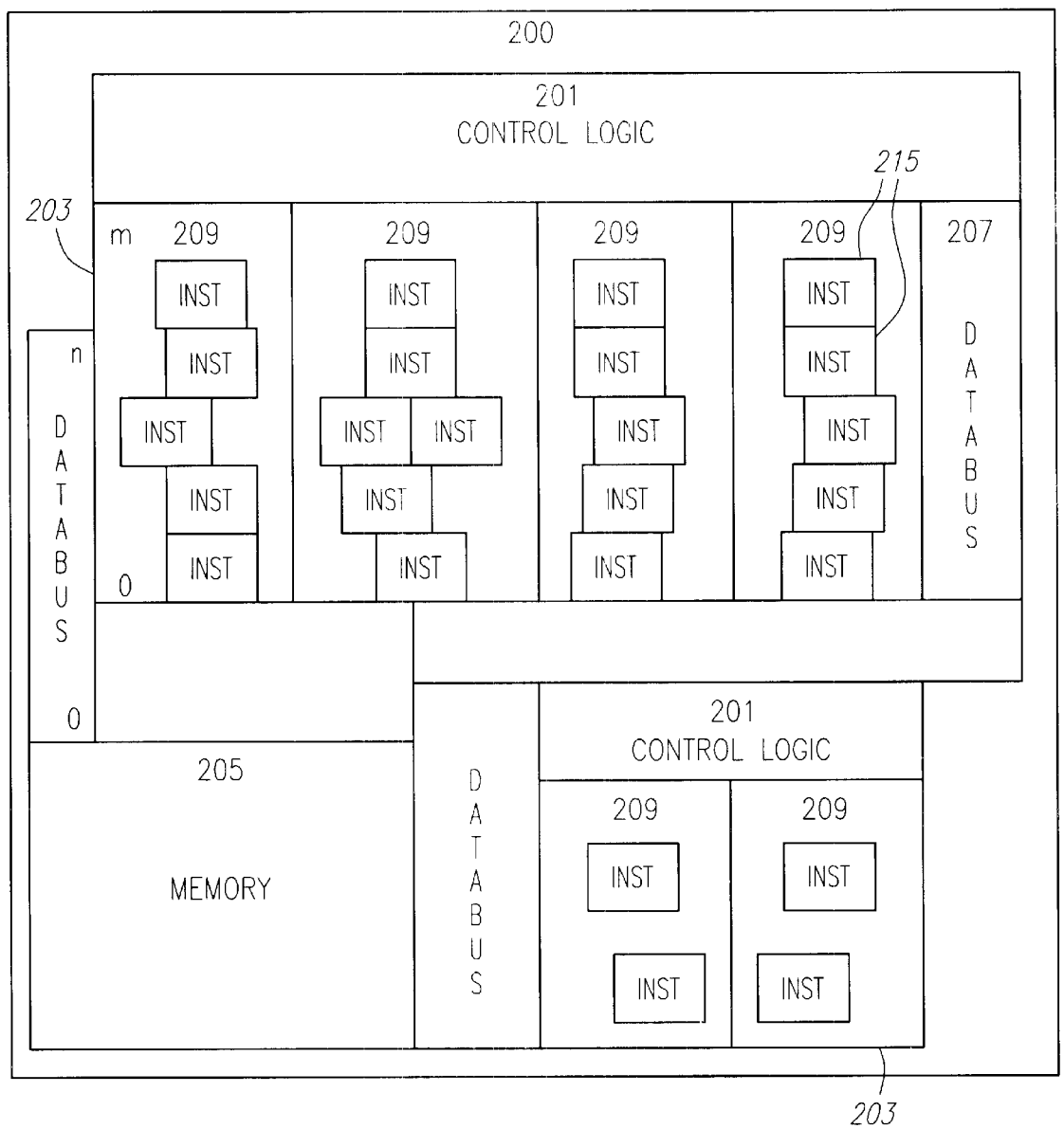
FIG. 2 is a diagram of a simplified integrated circuit design.

Referring now to FIG. 2, there is shown a schematic illustration of a simplified integrated circuit 200 showing regions that may be represented by data stored in the layout database 195. In actual, more realistic integrated circuit designs, the integrated circuit 200 would be far more complicated. However, FIG. 2 is useful for purposes of illustration. As shown therein, the integrated circuit 200 comprises of a plurality of control logic regions 201, datapath regions 203, and memory 205. The various control logic regions 201, datapath regions 203 and memory 205 are interconnected with databuses 207 generally spanning multiple bits. In most integrated circuits 200 manufactured at the present time, databuses 207 are 16, 32, or 64 bits wide. Each datapath region 203 may comprise a plurality of datapath functions 209. A datapath function 209 may utilize some or all of the bits available from the databus 207. A datapath function 309 may comprise a plurality of cell instances 215 which enable some form of signal or logic transformation of the data passed by the databus 207. The cell instance 215 within a datapath function 209 generally operates on the data carried on the datapath function 209. As represented in the schema of the layout database 195, the integrated circuit 200 is comprised of a plurality of instances and a plurality of nets. A net interconnects a number of instances, by associating pins on each of the instances.

According to one embodiment as described herein, a database useful in electronic design automation (EDA) applications is provided. In this database, integrated circuit data such as netlists, cell instances, and cell names are organized into classes. In a preferred embodiment, the database of the present invention is implemented in the C++ language. Although the object-oriented features of C++ provides useful functions such as information hiding and operator overloading, the database of the present invention may be implemented in non-object-oriented languages such as C.

Figure 3:
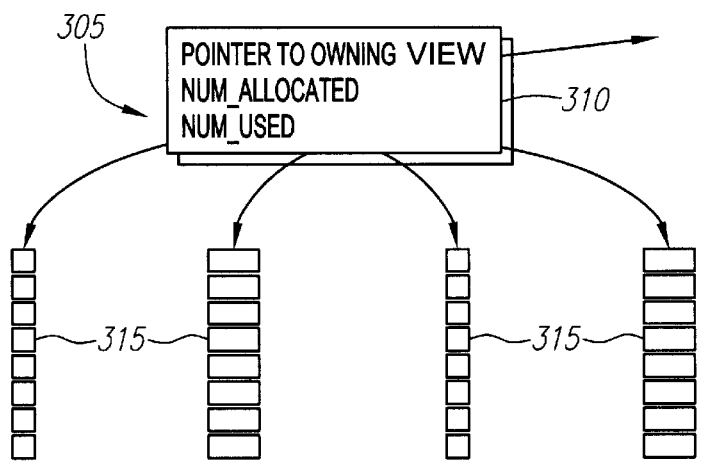
FIG. 3 is an illustration of a class according to one embodiment of the present invention.

Turning now to FIG. 3, a typical class 305 in the database of the present invention is illustrated. The class 305 comprises a data header 310 and one or more parallel arrays 315. The data header 310 may include the number of objects that have been allocated ("num_allocated") and the number of objects currently in use ("num_used"). In the example of FIG. 3, num_allocated would be eight because each of the parallel arrays have a rank of eight. If data were entered in five records of each parallel array 315, then num_used would be five. For those classes which are often changed during the use of the database, the data header 310 may also contain a "garbage" index field indicating the index of the first unused record. The rest of the unused records are linked using one of their existing fields as a continuation index link, or −1 for the end of the list. Such a system allows blank records to exist in the middle of the parallel arrays 315.

The data header 310 and parallel arrays 315 are preferably implemented as C++ structures for storing the data associated with the class 305. Often, there may be only a single array 315 a particular class 305. There may also be additional parallel arrays 315, depending upon the size of the class 305.

Figure 3A:
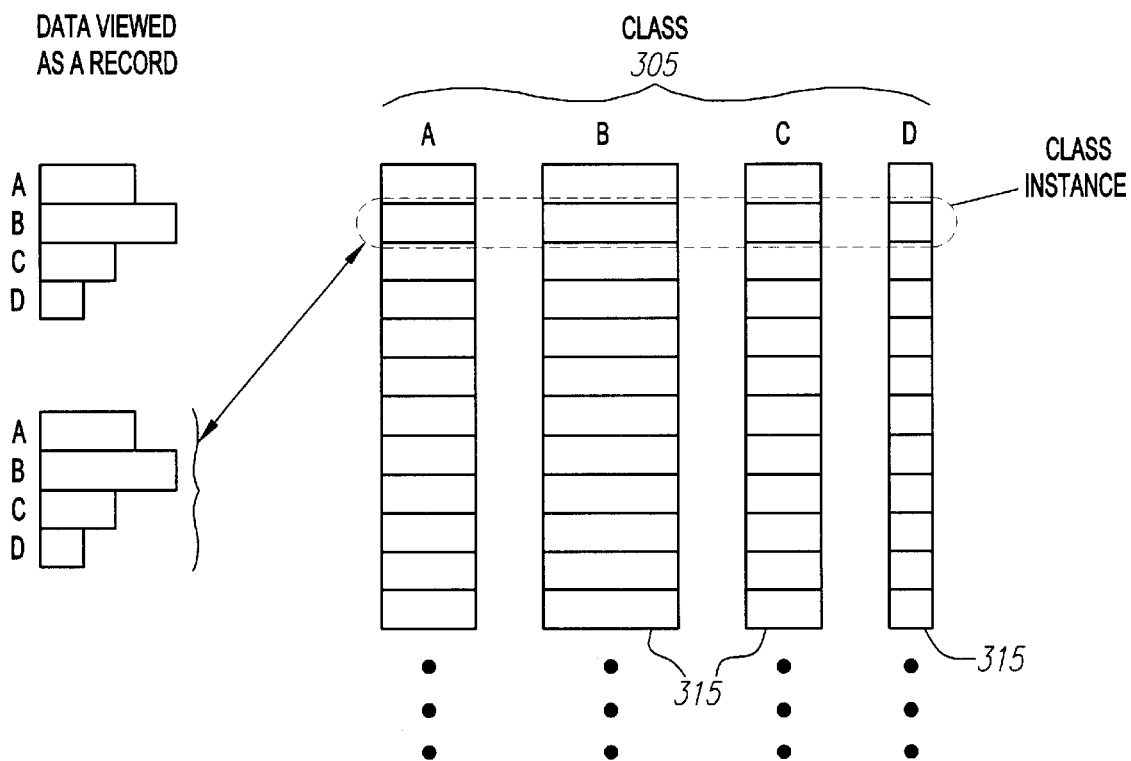
FIG. 3A is a conceptual diagram relating different ways of viewing a class instance from an abstract perspective.

In a preferred embodiment, the same array index number is used across all of the parallel arrays 315 to access a given class instance. In one aspect, the union of all the parallel arrays at a given index number provides a virtual structure for the class instance. Viewing the database structure in another respect, each parallel array 315 generally corresponds to a single field of a class, and the entries from the various parallel arrays 315 at the same array index number provides a single class instance. In the example illustrated in FIG. 3, there are four parallel arrays 315 of different widths, so each class instance would have up to four "fields", with one entry from each of the four parallel arrays 315. FIG. 3A illustrates conceptually how a class instance, viewed as a data record, might correspond to entries at the same array index number across parallel arrays A, B, C and D (corresponding to "fields" A, B, C and D of a data record).

Once the database structure is determined, additional fields may readily be added by adding another parallel array 315 for each new field. Because additional fields are readily added, there is no need to permanently associate additional memory (such as a generic work field) with a given class, providing a substantial memory savings over certain types of conventional databases. Also, no internal pointers are necessary within a given class 305, as the information across the parallel arrays 315 is inherently associated together by a common relative position within each parallel array 315, as reflected in the index array number for the class instance.

Figure 4:
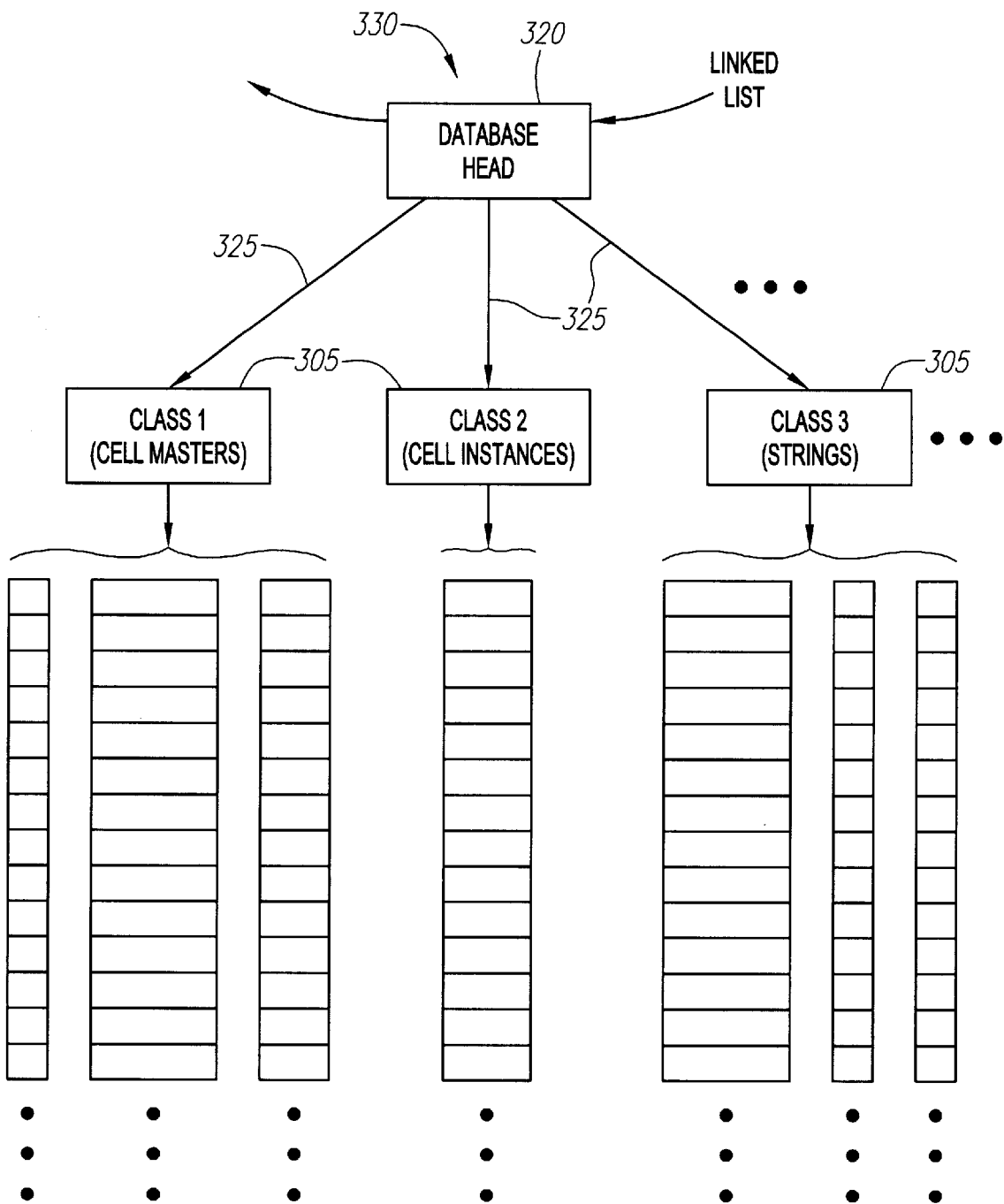
FIG. 4 is an illustration of a database comprising a plurality of classes according to one embodiment of the present invention.

In a preferred embodiment, pointers are not necessary to relate one class to another. Instead, an integer index is used to relate an object in one class to an object in another class. In such an embodiment, pointers would be used to identify each individual class as a whole. A preferred version of such an embodiment is illustrated in more detail in the example shown in FIG. 4. As illustrated therein, a master database header 320 keeps track of the locations of the various classes 305 within the database 330. In the example of FIG. 4, the plurality of classes 305 might include, for example, the Cell Master class, the Cell Instance class and the String class. The master database header 320 preferably includes a pointer 325 to each class 305, and each class preferably can access the master database header 320 through a local pointer (not shown) or a global pointer. Because there may be several databases 330 in memory at once, the various master database headers 320 (only one of which is illustrated) may be related to one another by pointers in a linked list configuration.

Information stored within a particular class 305 may be associated with information stored within another class 305 (i.e., the "target" class) by using the array index number for the information within the target class 305 for which an association is desired. The information in the target class 305 may be accessed using the array index number for the information within the target class, in conjunction with the pointer to the master database header 320 and the pointer 325 to the target class 305. For example, information within Class 3 may be associated with information within Class 1 by storing an array index number in the class instance in Class 3 corresponding to the appropriate class instance in Class 1, and the information can be accessed by using the pointer 325 to the master database header 320, from which the pointer 325 to the Class 1 can be obtained. Thus, cross-associations between classes 305 may be readily implemented using only an array index stored within a class instance, along with the pointer to the master database header 320. Cross-associations between classes 305 therefore do not require pointers to implement, which can save large amounts of memory space, particularly when utilized in connection with the parallel array structure for implementing classes, wherein a class instance is defined by a common array index as opposed to, for example, a set of pointers to data.

Figure 5:
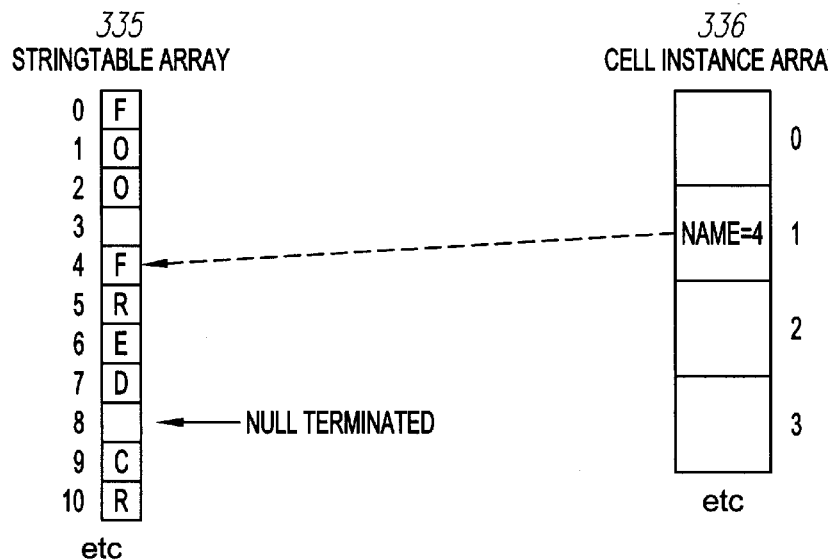
FIG. 5 is an illustration of inter-class relationship through index numbers.

A specific example is provided in FIG. 5, wherein a given cell instance within a cell instance class 336 is associated with a string within a stringtable class 335. The cell instance class 336 and stringtable class 335 are depicted for convenience as "single" arrays in FIG. 5, but this depiction is for conceptual purposes; both the cell instance class 336 and stringtable class 335 may each, in fact, comprise a plurality of parallel arrays, as shown earlier with respect to FIG. 3. In this regard, it may be appreciated that a class generally appears as a single, coherent array to the end user, who may have no knowledge that the actual data forming the class is drawn from separate and distinct parallel arrays. Continuing now with the example in FIG. 5, the stringtable class 335 stores all the string instances in the view (i.e., in the particular level of hierarchy in the database). Similarly, the cell instance class 336 stores all the cell instances in the view. In this example, the stringtable class 335 comprises a long array of bytes with a number of text strings of various sizes concatenated together using NULL characters as separators. Each text string occurs only once and is looked up with a hash table. Other classes needing the data stored in the stringtable class 335, such as (in this example) the cell instance class 336, "store" text strings as array indexes into the stringtable class 335. Thus, in the example of FIG. 3, the record at location [1] of the cell instance class 336 stores an integer (e.g., "4") in its name field, and the integer acts as an array index into the stringtable class 335. The stringtable data starting at location [4] is "FRED". Thus the name of the class instance at location [1] of the cell instance class 336 is "FRED".

By relating classes through index numbers (integers) rather than through pointers, the present invention conserves vast amounts of working memory. For example, in conventional 32-bit computers, each pointer is 4 bytes, and in more modern 64-bit computers, each pointer is 8 bytes, doubling the amount of storage required. However, because the database structure described herein preferably uses index numbers rather than pointers to cross-relate data among parallel arrays and classes, the storage requirements for information are independent of the computer's addressable working memory space. As a result, increasing processing power from a 32-bit computer to a 64-bit computer will not double the required storage for the index numbers.

In a preferred implementation in which C++ is used as the programming language, it may be observed that variables of type integer ("int") are stored in 4 bytes, regardless of whether a given integer could be stored in fewer bytes. Although the present invention limits the use of pointers, the memory savings would be less significant if, through the preferred use of the C++ language, every single index number had to be stored in 4 bytes. Thus, two techniques are provided herein for reducing the required memory. In the first technique, the parallel arrays 315 of a given class 305 adaptively store integers in variable byte sizes—for example, from one to four bytes. Such parallel arrays 315 are referred to as "intelligent integer arrays" herein. In the second technique, discussed later herein, the integers are "bytestream encoded" whereby the data is interpreted positionally.

Figure 6:
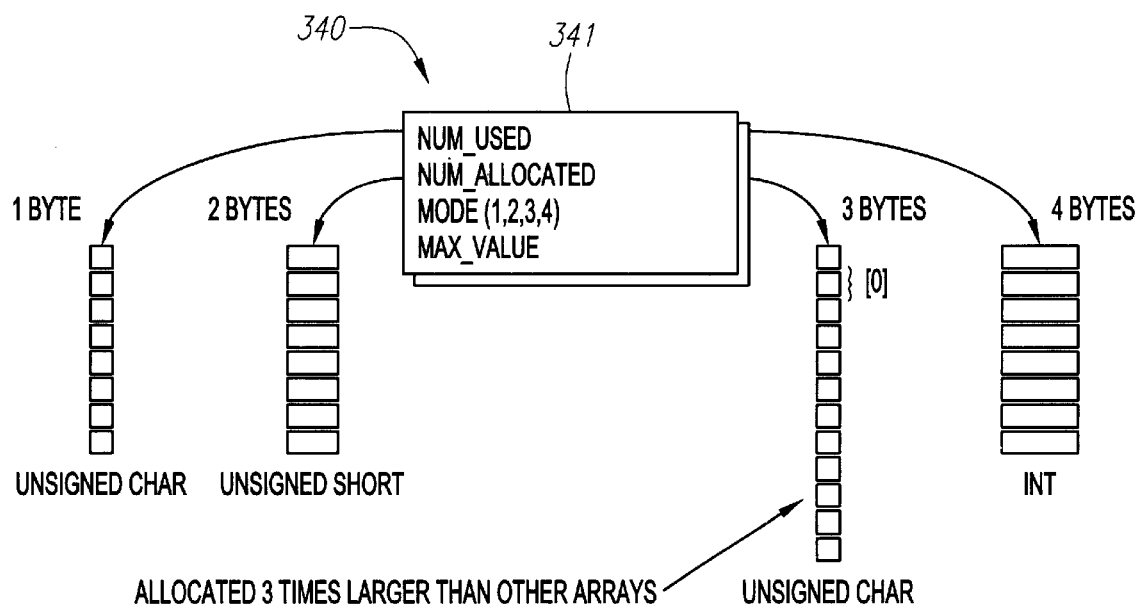
FIG. 6 is an illustration of a class that adaptively allocates record storage size depending upon the maximum size of the stored integers.

Turning first to the use of intelligent integer arrays, attention is drawn to FIG. 6. As shown therein, an adaptive class 340 utilizing an intelligent integer array includes a data header 341 preferably having "num_allocated" and "num_used" fields discussed earlier. In addition, the data header 341 of the adaptive class 340 includes a maximum value field ("max_value") which indicates the largest entry allowed in the current mode of the adaptive class 340. As a default mode (which can be specified in a constructor of the adaptive class 340), each of the parallel arrays of the adaptive class 340 is set to 0 byte mode. Whenever a new data entry is made into the adaptive class 340, the value of the entry is checked against the current max_value field. If the entry exceeds max_value, the adaptive class 340 reconfigures to a new mode which has a max_value large enough to store the new data entry.

In one embodiment in which the preferred programming language of C++ is used, the different modes of the adaptive class 340 are defined as follows:

| Mode | Type | Maximum Value |
| --- | --- | --- |
| 0 byte | NULL | −1 |
| 1 byte | unsigned character | 254 |
| 2 byte | unsigned short | ~64000 |
| 3 byte | 3 sequential unsigned characters | ~16 million |
| 4 byte | int | ~2000 million |

The 0 byte mode is particularly useful when all the data is NULL values (i.e, when the database is not using this field). This mode takes up almost no memory. In sharp contrast, an unused field in most prior art databases will always take up memory space. The 1 byte, 2 byte and 3 byte modes use C++ unsigned bytes to maximize the range. Because unsigned bytes are used, special accommodation may need to be made to provide for NULL values. Typically, a value of −1 is used in the database to represent a NULL pointer in the 0 byte mode, whereas [0] would be the minimum legal index allowed in the unsigned storage of class 340. In a preferred embodiment, therefore, when data representing an index pointer is stored in the database it is, transparently through internal processing, incremented by one (making NULL or −1 values a legal "0" value, and increasing all other values by one), and when the data is retrieved its value, again transparently through internal processing, is decremented by one, so that all data is returned to their original values when retrieved.

The data header 341 preferably includes an additional field, designated "mode(1,2,3,4)" in FIG. 6, to indicate the particular mode implemented for the adaptive class 340.

It may be observed that in present versions of C++, no variable type is provided that consists of three bytes. Thus, in accordance with one embodiment as disclosed herein, in the 3 byte mode an individual data entry consist of three sequential unsigned characters. Assuming that num_allocated is an arbitrary integer n in the other modes, in the 3 byte mode, the actual num_allocated would be 3n. However, because C++ allows the use of overloaded operators, users of the adaptive class 340 need not be aware of the particular mode implemented—the arrays are accessed by index number as are all the other arrays of the database.

Some examples will illustrate the memory saving benefits of the intelligent integer array. A number of classes are commonly used in an chip design database, and some of these classes, such as Layer, Master Cell, and Master Port, have a very limited number of possible entries, so that they will usually be referred to by other classes with index numbers that have relatively little dynamic range. For example, there are typically well under 254 (the maximum value representable by one byte, assuming provision for a −1 or NULL value) layers in an integrated circuit database, and so other classes can always refer to the Layer class with index numbers that are less than 254—i.e., less than a single byte of information. Thus, the 1 byte mode could be used for an array of indexes referencing the Layer class. Similarly, the 1 byte mode could typically be used for arrays of Cell Master indexes or Port Master indexes. Even for classes with index numbers having a relatively large dynamic range, such as Cell Instance, the index number would still be expected to be under 4 bytes in virtually all contemplated situations, even in the most current deep submicron (DSM) designs. The 3 byte mode is expected to accommodate most any integer required for a class index in a chip design database, providing a substantial memory savings by avoiding a 4 byte "int" type storage.

In another embodiment, bytestream encoding is used as an alternative to the use of intelligent integer arrays. Bytestream encoding is particularly useful for data which has a wide dynamic range (i.e., a wide expected value range) and thus might not be as efficiently stored using an intelligent integer array. In a preferred embodiment implementing bytestream encoding, an array of unsigned characters (1 byte) is used to store variable-length data, with additional bytes being allocable depending upon the data value. The first byte in a data entry, and more specifically the first nibble (4 bits), indicates via a header code how many subsequent bytes need to be read to retrieve the integer value. Because less than 16 types of header codes will allow encoding of integer values up to 5 bytes (which is a huge number for even foreseeable databases), the header code can be stored in the first 4 bits of the start byte. This leaves the top 4 bits in the start byte available for storing data. The type of header codes may, in one embodiment, be as given in the following table:

| Header Code | Size and Maximum Stored Value |
| --- | --- |
| +1 byte | start byte only, values 0 to 15 (4 bits) |
| −1 byte | start byte only, values 0 to −15 (4 bits) |
| +2 byte | start byte and 1 additional byte, values 0 to 4095 (12 bits) |
| −2 byte | start byte and 1 additional byte, values 0 to −4095 (12 bits) |
| +3 byte | start byte and 2 additional bytes, values 0 to 1,048,575 (20 bits) |
| −3 byte | start byte and 2 additional bytes, values 0 to −1,048,575 (20 bits) |
| +4 byte | start byte and 3 additional bytes, values 0 to 268,435,455 (28 bits) |
| −4 byte | start byte and 3 additional bytes, values 0 to −268,435,455 (28 bits) |
| +5 byte | start byte and 4 additional bytes, value (HUGE) (36 bit integer) |

Because the data is interpreted positionally, the start byte of each integer needs to be known in order to make it accessible.

The memory savings of bytestream encoding may be significant. Consider, for example, a case in which one million integers are to be stored, all having values of less than 255. Using an intelligent integer array, as previously described herein, all one million integers could be stored in the 1 byte mode. If, however, a single entry were added of value 256, the storage space might double because the number of bytes needed to store the data of an intelligent integer array is determined by the maximum value that is stored. However, using bytestream encoding the data is encoded on an individual basis, resulting in one million 1-byte records and a single 2-byte record. Effectively, the "rogue" value did not penalize the storage requirements for the other one million entries.

Additional memory savings can be achieved by providing additional header codes tailored to applications particular to certain chip design scenarios. For example, because many routing coordinates and other data tend to lie on a fixed routing grid, the stored data may be normalized by the coordinates of the grid, making it easier to fit into a smaller number of bytes, provided that the division can be accomplished without losing information. An additional set of header codes may then be provided, similar to the previously described header codes, which indicate that the encoded value must be multiplied by the coordinates of the routing grid when read out.

In chip design applications, a significant use for bytestream encoding may be in connection with the Shape class. A shape is the most primitive object of routing, and can take the form, for example, of a Rectangle, Path, Line, Point, etc. The number of items associated with a particular shape depends upon what kind of shape it is. A rectangle, for example, requires a bounding box, while a point requires only the X, Y coordinates. Most shapes are associated with a particular net, so that the shapes in the database must be linked together in a linked list so they can be found by their owner net. Because an integrated circuit database may contain millions of shapes for a given circuit design, it is important to keep memory usage low for the Shape class.

In one embodiment, memory space is conserved by bytestream encoding each particular shape. The number of bytes used for this bytestream encoding depends upon the encoded data. Each shape preferably starts with a header code to indicate what type of shape it is, followed by the unique data for that type of shape.

Figure 7:
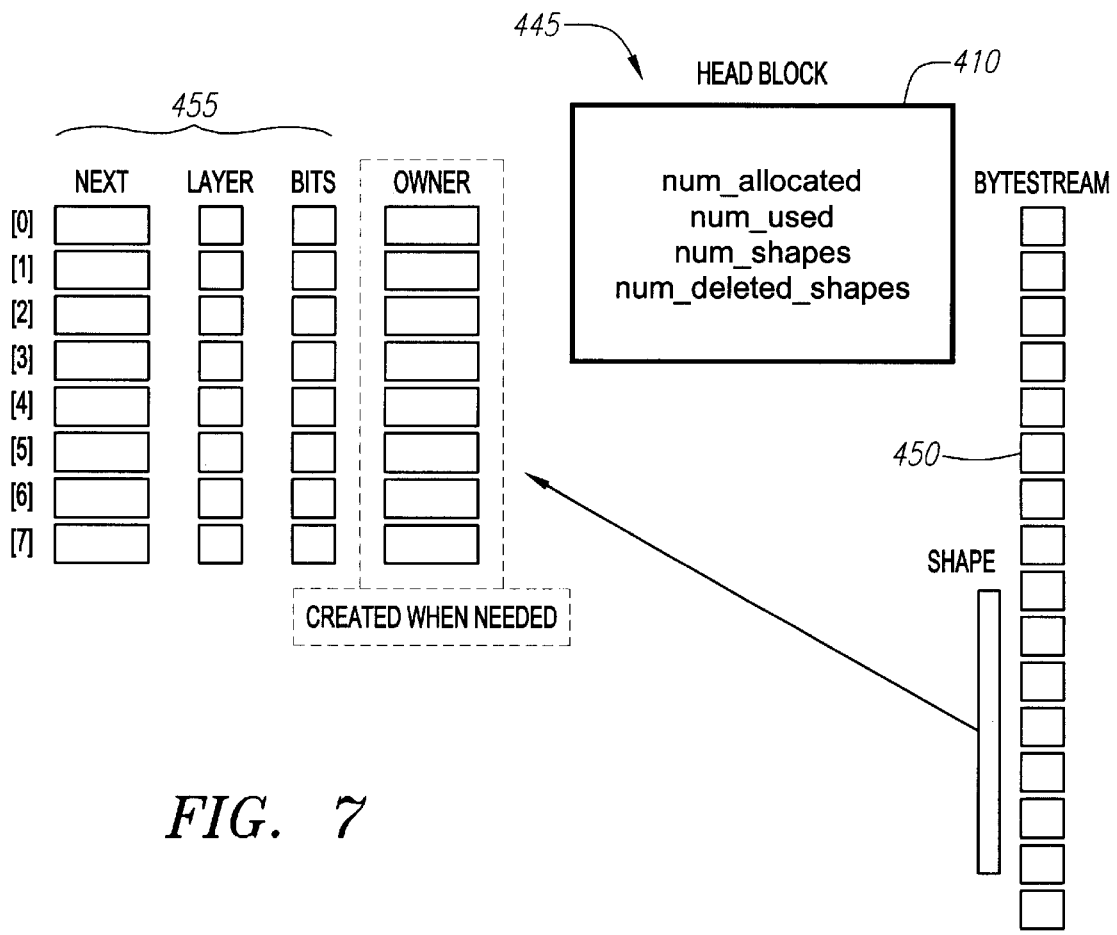
FIG. 7 is an illustration of a bytestream encoded class.

Turning to FIG. 7, a bytestream encoded Shape class 445 is illustrated. A 1-byte bytestream array 450 (unsigned characters) holds the bytestream encoded data. In addition, in one embodiment, the bytestream array 450 contains an index into other parallel arrays 455, which hold volatile data associated with each shape. For example, the Next array holds the index to where the next shape starts in the bytestream array 450, and would vary in length depending upon the integer value being stored. The Layer array indicates the layer associated with a given shape. The Owner array is not actually stored on disk but is built instead, when needed, by starting from each Net and Pin and marking all the associated shapes.

Each parallel array can be an intelligent integer array (although the Bits array, which can store boolean fields, would typically be a simple array of unsigned characters). The Net record itself preferably has an index number pointing to its first shape. The arrangement of FIG. 7 allows the user to easily change the data stored in the parallel arrays. If the bytestream array 450 must be altered, a shape may be deleted and re-encoded. The resulting deleted shape is not referred to by anything, although a count of the deleted shapes may be stored in a special field ("num_deleted shapes") of a data header 410, and a cleanup process may be used to re-encode the shapes from scratch. Moreover, because the shapes are bytestream encoded, bounding boxes and paths are encoded as delta values rather than absolute values. Thus a bounding box may be stored as x1, y1, (x2−x1), (y2−y1), instead of x1, y1, x2, y2.

This general design principle of using bytestream encoding and delta values is applicable in many situations. For example, one application of a bytestream encoded class is referred to as a "From-To" class, and has certain advantages for efficient memory usage, particularly with respect to routing information. It is generally very important to store routed connections efficiently for computer aided design (CAD) applications. As integrated circuit designs have become larger and larger, the memory needed to store the physical routing is becoming critically close to current machine limits. The "From-To" bytestream encoding techniques described herein allow for storage of physical routing data in a much compressed form.

Figure 8:
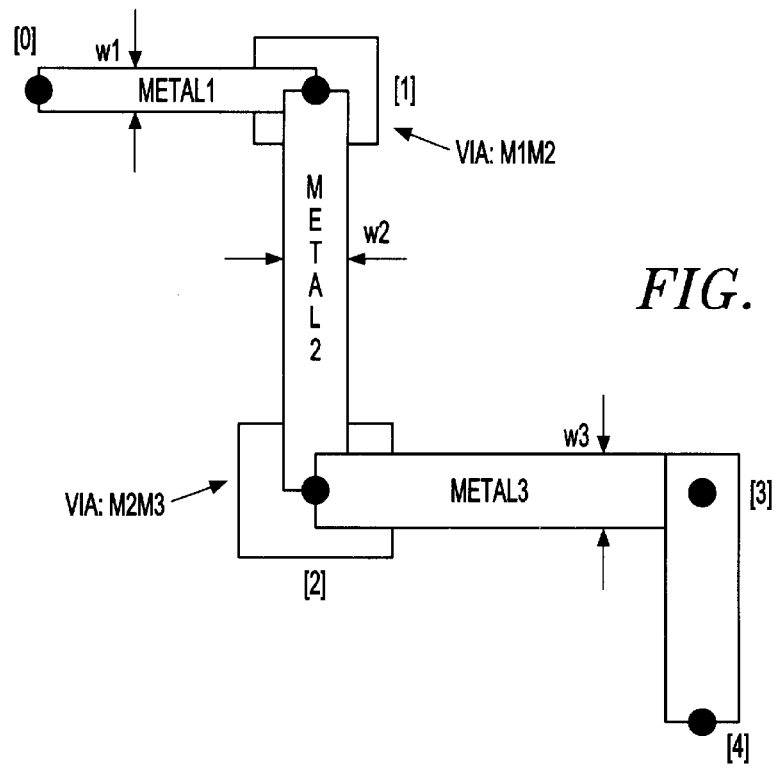
FIG. 8 is a diagram illustrating a "From-To" connection for an exemplary integrated circuit.

A "From-To" is essentially a vectored path of connectivity, which can change layer and width as desired. The principles of "From-To" bytestream encoding may be explained with reference to FIG. 8, which shows an example of a routing path. The routing path consists of a conduction path, which starts at a particular place on an integrated circuit and terminates at another place on the integrated circuit. This conduction path is called a "From-To" and is considered a single object. The routing is achieved with a set of From-To's which start and end at particular component's terminals (or simply at the start/end of other From-To's). When there is a layer change in a routing path, there is usually an associated "Via" instance (a somewhat complicated structure which connects the two layers together electrically). In the example of FIG. 8, the From-To has five corner points corresponding to the points denoted as [0] . . . [4]. The From-To in the example of FIG. 8 changes layer twice: first from METAL1 to METAL2, and then from METAL2 to METAL3. The width of the track is different for each of these three layers (METAL1, METAL2 and METAL3). Appropriate "Via's" are used at the layer change corner points. A From-To may have diagonal segments (not illustrated), but this is rare.

Consider the segment of the conduction path in FIG. 8 on layer METAL1. In most prior art databases, this segment (as would the other segments) would need records that stored a starting point, ending point, width, layer and, potentially, a via index at each end:

x1 y1 x2 y2 width layer via1 via2

Storage of such records in variables of type "int" would, in a language such as C++, require 32 bytes per segment. However, portions of this routing data may be viewed as redundant and need not be stored. For example, the starting coordinates for the next segment on layer METAL2 in FIG. 8 are the same as the ending coordinates of the previous segment on layer METAL1. According to one embodiment, a preferred database structure takes advantage of this and possibly other redundancies to conserve memory when bytestream encoding the "From-To" data.

Accordingly, memory space can be conserved by making certain assumptions when storing routing data. In one embodiment, the following assumptions are made when coding and reconstituting the bytestream encoded From-To data:

1) A path starts at coordinates [0,0].
2) Each layer starts as layer #0 (the first index in the layer array).
3) There is no layer change unless otherwise indicated.
4) There is no width change unless otherwise indicated.
5) When the layer is changed, assume the default via that connects the two layers unless otherwise indicated.

6) When the layer is changed, assume the default width for the new layer.

The header codes for the bytestream encoded From-To class attempt to store the integer data in as few bytes as possible. The following are a few examples to illustrate the technique:

SEG_INT_HORIZONTAL: The next 4 bytes contain an integer that should be added to the current X coordinate.

SEG_SHORT_NEG_VERTICAL: The next 2 bytes contain an integer that should be subtracted from the current Y coordinate.

G_SEG_3 BYTE_NEG_VERTICAL: The next 3 bytes contain an integer that should be multiplied by the routing grid and then subtracted from the current X coordinate.

SEG_SHORT_WIDTH: The next 2 bytes contain an integer for the new width.

Because the header codes are relative to the current X,Y coordinate, the deltas (changes in X and Y) tend to be small numbers and can typically be encoded into one, two or three bytes, instead of the usual four bytes required for an integer in languages such as C++.

Moreover, in one embodiment, the header code is expanded to include the entire first byte. This allows the use of additional header codes, which are particular to a class. Thus, the additional header codes are specific to particular aspects of the class, such as segment widths, diagonal segments, and vias (including stacked vias) in a From-To class.

The most prolific header code is generally for a layer change. Because a typical database will not require more than 127 defined header codes, a convention may be adopted wherein any header code with a value greater than 127 indicates a layer change. The new layer index number is obtained by subtracting 127 from the value of a header code which has indicated a layer change. Because a typical database in EDA applications will normally have far fewer than 127 layers, this technique will nearly always suffice. If, however, the database requires more than 127 layers, larger header codes may be used to store the layer index.

Figure 9:
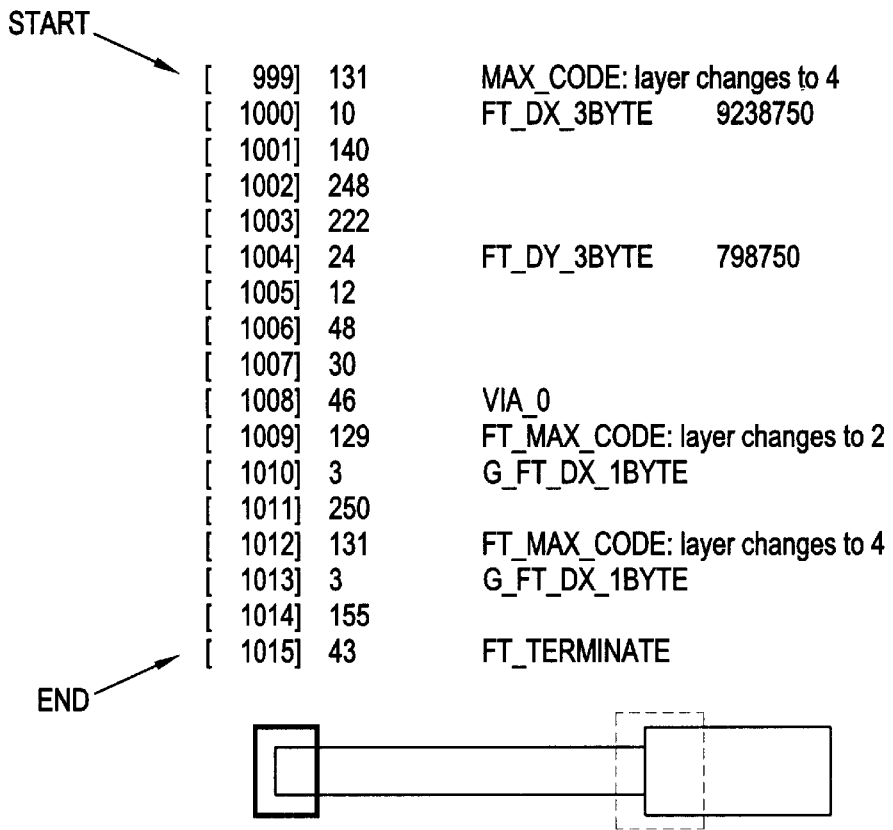
FIG. 9 is a diagram showing an encoded bytestream array for a "From-To" connection.

An example of "From-To bytestream encoding in accordance with the above principles is shown in FIG. 9. The data for the particular From-To illustrated in FIG. 9 begins at array index [999]. There, the header code "131" indicates a layer change to layer #4 because of the convention that header codes greater than 127 indicate a level change. The header code at the next array index (i.e., array index [1000]) indicates the next three bytes should be interpreted as a change in X coordinate of +9238750. After these three data bytes, the header code at array index [1004] indicates a change in Y coordinate encoded in the subsequent three bytes. Thus, the coordinates of the From-To at that point are (9238750, 798750). The header code at array index [1008] indicates that there is a VIA at this coordinate, and that the via type is #0. The header code at array index [1009] changes the layer to layer #2 (because the header code exceeds 127 by an amount of 2). The header code at array index [1010] instructs that the next single byte, multiplied by the routing grid, is to be interpreted as a change in X coordinate. The X coordinate thus changes to 9263750. The header code at array index [1012] changes the layer back to layer #4. The header code at array index [1013] indicates that the next single byte, multiplied by the routing grid, is to be interpreted as a change in X coordinate. The X coordinate thus changes to 9279250. The header code at array index [1015] indicates that the From-To has been completed.

In the example shown in FIG. 9, since the default widths for each layer were used, they were not encoded in the bytestream. Only one Via was encoded, since the second layer change used the expected Via. This small section of bytestream has effectively implemented two horizontal rectangles of material and two Via instances. Even though the coordinates are quite large, the data can be encoded very compactly since all the coordinates (except the start) are relative to the previous coordinates. In addition, if the coordinates are amenable to being divided by a known global routing grid, the values can be encoded in fewer bytes, saving even more room.

While intelligent integer arrays and bytestream encoding described above represent two powerful features to minimize the required memory, other features may also be provided to further reduce memory storage requirements. For example, every object in the database can have a property assigned to it, permitting the dynamic addition of information to each object. The property may include a Name and a Value. In one embodiment, the Value can be chosen as one of the following:

TEXT

LIST (like TEXT but used in LISP)

INTEGER

BOOLEAN (1 or 0)

FLOAT

3×FLOATS (triplet)

3×INTEGERS (triplet)

TIME_T (unix time code)

It would generally be advantageous to minimize the amount of memory needed to store properties. For example, many owners (i.e., the objects potentially possessing a property) do not have properties, and it would be very wasteful of memory to have a dedicated 'first_property' field for each object, especially in the case of "Instterms" which can run into the millions. Thus, it is preferred to provide a dynamically creatable lookup mechanism which can find the first property of a particular owner quickly. There are at least two techniques for accomplishing this lookup mechanism: first, a parallel lookup array (which may be an intelligent integer array), and second, a hash table.

To implement either of these two lookup techniques, in accordance with a preferred embodiment, during the creation of a property array the first property is marked as being "FIRST" (using a bit field). Also, the number of owner lists is summed during the creation of the property array. For a hash table, the number of owner lists indicates how much memory will be needed to store the hash table. For a parallel array, the number of owners determines the array size, and hence the size of memory needed to store it. Choosing between the two methods depends primarily upon the number of owners possessing a property, with some bias given to the parallel lookup array where memory needs are comparable in view of its quicker speed over the hash table.

In the case in which a parallel array is used as the lookup mechanism, each Property class preferably stores in its parallel arrays (preferably intelligent integer arrays) the following:

NAME

OWNER (an index number into some other class)

NEXT (next property in a linked list with same owner)

DATA (various)

Figure 10:
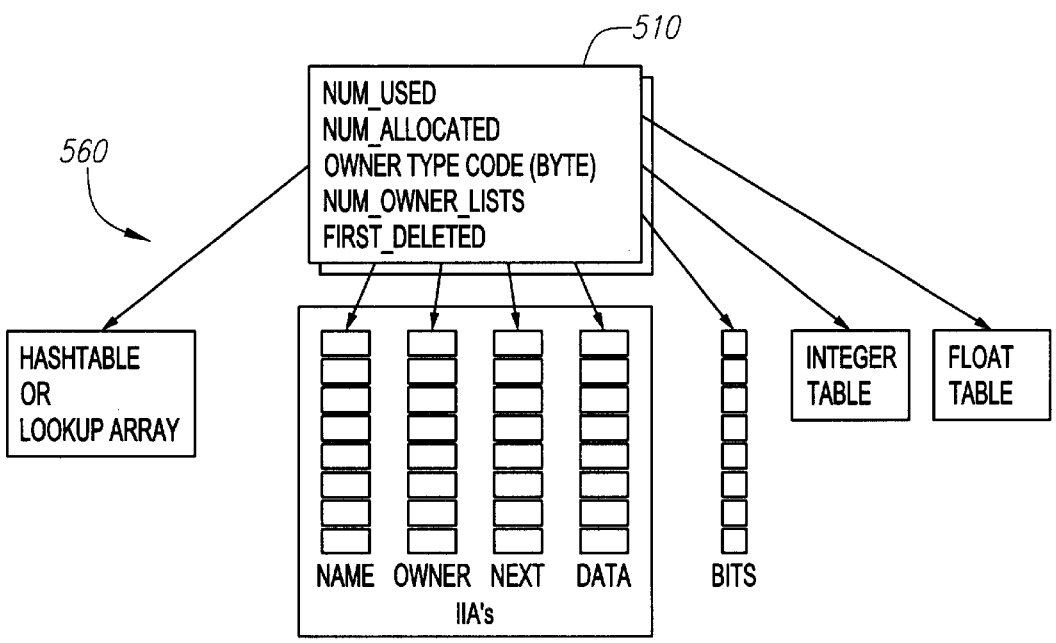
FIG. 10 is a diagram of a parallel property array.

Turning now to FIG. 10, an example Property class 560 comprising parallel intelligent integer arrays is illustrated. The head block 510 of the Property class 560 includes the usual "allocated" and "used" counts, as previously described herein. The head block 510 also preferably stores information indicating what kind of class each instance of the properties belong to (an instance of the Property class exists for each type of database object). When a property is deleted, it may be put on a garbage list for reuse.

The lookup mechanism (either the hashtable or the lookup array) can be built on the fly, especially since the FIRST properties on each linked list are marked, so it is relatively simple to look through the property table for these start properties. The NAME, OWNER, NEXT and DATA fields are all preferably intelligent integer arrays. The BITS array is an array of unsigned characters. There are two new tables added, which are classes to store arrays of 4-byte integers and float values.

In a particular embodiment, the method for storing the DATA for each property varies depending upon the type of property:

TEXT, LIST: the DATA array is an index into the STRINGTABLE

INTEGER, BOOLEAN, TIME_T: the DATA array stores the integer value

FLOAT: the DATA is an index into the FLOAT TABLE array of floats

3×INTEGER triplet: the DATA is an index into the INTEGER TABLE—the sequence of 3 integers are the next sequential integers in the table.

3×FLOATS triplet: the DATA is an index into the FLOAT TABLE—the sequence of 3 floats are the next sequential floats in the table.

Figure 11:
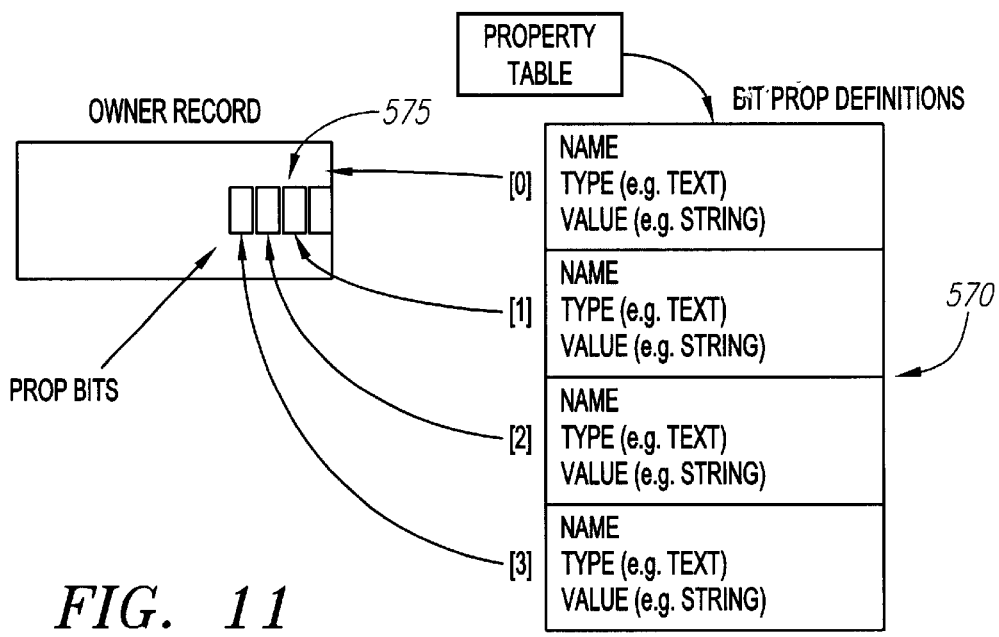
FIG. 11 is a conceptual diagram showing a mapping between unused bits in an owner record to a property table.

Although the Property class of FIG. 10 is very efficient, it potentially may still use more memory than is desired. Accordingly, further efficiencies may be achieved by storing property values at the owners where possible. Many common properties often have but a few possible values. This phenomenon can be taken advantage of by using bits within the Owner class to store the properties rather than relying entirely upon a hash table or parallel array. Each Owner class usually has a few spare bits for general use. By establishing a uniform interface scheme, the database can set/interrogate the bits from the property class. The functions that may be used for this purpose are as follows:

int MaxBitProperties; // returns how many bits are available for use void SetPropBit(int ownerindex,int bitindex);// set a bit TRUE void UnSetPropBit(int ownerindex,int bitindex);// set a bit FALSE Boolean TestPropBit(int ownerindex,int bitnum); // test a bit These functions can be implemented for each class; some classes may not have any available bits, in which case MaxBitProperties( ) would return zero. In FIG. 11, a mapping between unused bits and a property table array is illustrated. Each property table array 570 has a set of defined property name/values, the index of which corresponds to the bit number associated with it on the unused bits 575 within the respective owner record. Whenever a property is searched for, the Bit Properties are first examined on the relevant owner to see if that property is present. This is done before resorting to the normal, typically much slower, lookup. When a property is added, the database will also look at the Bit Property definitions to see if it is present. If it is found, then the lookup for the first property in the owners list is avoided. This procedure speeds up lookup and additions of common properties. It also greatly reduces the memory needed to store them.

The BIT properties are preferably not hard-coded, but rather registered by the user application at startup time. For example, the code could be:

GNStop.RegisterProp(GNS_SHAPE,PROPTYPE_TEXT, "dpRtStatus","routed");

GNStop.RegisterProp(GNS_INSTANCE,PROPTYPE_TEXT,"dpRtStatus","routed");

GNStop.RegisterProp(GNS_INSTANCE,PROPTYPE_TEXT,"dpRtStatus","routed Special");

These definitions are preferably stored in the property table array 570. Whenever a Property Table constructor is called, the appropriate property definitions for that type of object are copied over.

Figure 12:
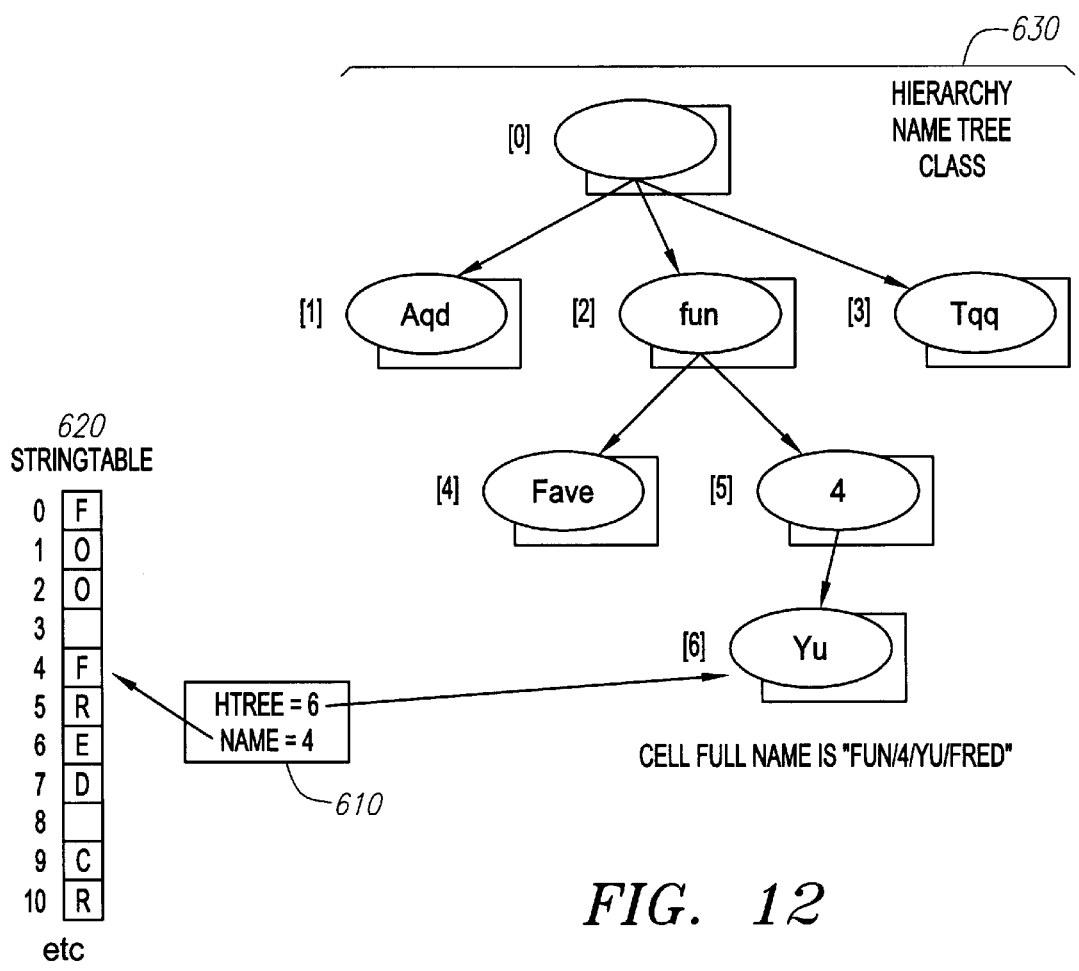
FIG. 12 is a block diagram showing an exemplary cell instance record as it relates to a hierarchy name tree and a string table.

Turning now to FIG. 12, an exemplary cell instance record as it relates to a hierarchy name tree and a string table is illustrated. If a view has been flattened, the instance and net names often contain a history of their position in the hierarchy. In this example illustration, a cell instance record 610 from an instance class stores two indexes instead of one. The "name" index references a string table 620 and gives the last part of the instance name. The "htree" index references a hierarchy name tree table 630, which stores string sequences, preferably in an array. Each entry in the hierarchy name tree table 630 has an index pointer into the string table 620 for its string, an index pointer back to its parent in the hierarchy name tree table 630, an index pointer to the first of its children, and an index pointer to the next string at the same level in the hierarchy name tree table 630.

When an instance name is encoded, the hierarchy name tree table 630 is searched to see if the start of the instance name is already defined. A particular hierarchy separation character is assumed, although this separation character is user definable. Additions are made to the hierarchy name tree table 630 as needed to store each new instance name. Thus, the hierarchy name tree table 630 builds up as more and more instances are added. This system, which is used for both net names and instance names, saves large amounts of memory in flattened databases.

Besides the aforementioned techniques, other advantages in conserving memory space and increasing database speed may be achieved from the fundamental arrangement of each class into one or more parallel arrays. For example, the inherent next and previous information that exists in an array can be used to great advantage. Aside from the ability to step forwards and backwards through the list, the database may associate records of two different arrays by their common, relative ordering. Thus, the ports on a cell, stored in consecutive records in a first array, can be assumed to be in the same order as the port definitions on the corresponding master, which are stored in consecutive records in the same relative positions in a second array.

As another advantage, due to the general lack of reliance on pointers, the disk version of the database can be almost exactly the same as the in-memory version. Moreover, the record arrays can be written and read with a single operating system call for each array, which is extremely fast. Since each record is of known size (as indicated in the data header), it is possible to quickly step over those arrays that are not needed. Thus, the parallel array database structure provides a read-on-demand capability for very little cost.

Another advantage provided by the fundamental arrangement of each class into one or more parallel arrays is that the classes may be incrementally loaded as needed. In a typical prior art database in which objects in one class relate to objects in another class only through the use of pointers, the database ordinarily could not be loaded incrementally, at least not conveniently so. This is because a substantial delay would be experienced in attempting to load a linked list database incrementally, since to skip a class would require that each record be read individually to locate the end of the class, and a class may have millions of members. However, in various database structures in accordance with the preferred embodiment(s) as described herein, such delay is avoided, because it can be readily determined how far to skip in order to reach the end of an array. This is because instances within a given class are related by array index number, not by pointers. Given the fact that the number of bytes in each array member is known, it can be readily determined how many bytes must be skipped to reach the end of an array. Where the database is implemented using the C++ programming language, the fseek( ) function call, which being a low level call is very fast, may be used to quickly skip over a class. For example, a million gate array can be fully skipped in hundredths of a second.

By incrementally loading in a database, a given class is only read into memory when needed. Because of the large size of some classes (e.g., the String class), providing an incremental loading capability allows substantial savings in the memory needed for application that does not need a particular class or classes.

Another advantage of using the various parallel-array techniques for implementing databases, as described with various preferred embodiments herein, is that the database can be largely machine independent. For example, a Sun workstation stores integers in a different byte order than does an IBM-compatible personal computer (PC). To make a database created by an IBM-compatible PC accessible to a Sun workstation, the Sun workstation must generally first swap the bytes to a different order, to make them correct for the Sun workstation data protocol. This transformation may be carried out by a relatively simple swapping process that can be part of the database software. In one embodiment, the database file starts with a known test integer. If the integer does not match the expected value, it is byte-swapped and compared again. If a match results, the successful byte-swap is noted, and thereafter byte-swapping is automatically applied as each class is read into memory. However, much of the parallel-array database need not be byte-swapped. For example, a 1-byte array, such as the bytestream array, or an intelligent integer array in 1byte mode, need not be swapped. Similarly, because data in the 3 byte mode of the intelligent integer array is formed from the internally-controlled concatenation of three consecutive bytes, an intelligent integer array in 3 byte mode also need not be swapped. Thus, relatively fast conversion of the parallel-array database can be accomplished between different machines.

The parallel-array-based class structure of the preferred embodiment allows databases created by machines of different processor sizes (e.g., 32-bit computers and 64-bit computers) to be used by one another, because the array structure is the same independent of the processor size. In prior art databases relying upon linked lists, however, such interoperability would be unavailable, because either pointers or pointer-offsets unavoidably get written along with the data on disk, and pointers (or pointer-offsets) for a 32-bit computer cannot be utilized, without modification, by a 64-bit computer, and vice versa.

Most of the features of the present invention described above are designed to reduce the amount of memory used for a design at the expense of speed. However, some users will have more RAM and/or disk space than others, and may wish to trade back memory savings for faster access times. Thus, in one embodiment, a "Control Knob" is provided to allow user adjustment of the compromise between speed and memory.

Adjustment of the "Control Knob" turns off and on various memory saving aspects of the present invention. Four main factors are involved. First, the 3-byte encoding and decoding for the intelligent integer arrays is much slower than the 1, 2 and 4-byte encoding because it involves AND'ing and SHIFTING three separate unsigned characters in order to store and retrieve the value. Thus, thus the "Control Knob" can turn off 3-byte encoding, thereby causing the intelligent integer arrays to go directly from 2-byte encoding to 4-byte encoding.

Second, the hierarchical name tree structure, used for storing cell and net names, drastically reduces the memory needed for those designs that have been flattened, but this memory savings is at the expense of speed. Thus, thus the "Control Knob" can turn off the use of the hierarchical name tree structures, thereby causing cell and net names to be saved normally. Third, the storing of delta coordinates using the routing grid instead of storing actual coordinates saves memory but slows the storing and retrieval of integers. Thus, the "Control Knob" can turn off the use of delta data values instead of actual data values. Finally, when objects are deleted from the database, there may be some imbedded unused data. When the garbage percentage of a particular array becomes intolerable, it "Garbage Collects" to get rid of it. This involves reconstituting the array in most cases, which may pause the process. If the user is not interested in garbage collecting (except, maybe on db writeout), he can turn it off with the "Control Knob."

Utilizing the various embodiments as described herein, a fast, flexible and efficient database is provided. Experimentation has shown that databases constructed and utilized in accordance with the inventive techniques described herein can increase read and write speed by 20 to 100 times. Furthermore, the size of the database will normally be much smaller (e.g., 3 to 6 times smaller) than those relying upon pointer lists.

Although the database of the present invention was described with respect to integrated circuit EDA application, those of ordinary skill in the art will appreciate that the principles of the database could be readily adapted to other applications, such as printed circuit board design. Thus, it is to be understood that the embodiments described herein are merely illustrative of the many possible specific arrangements that can be devised to represent application of the principles of the invention.

What is claimed is:

1. A method for managing information in a database used for automated electronic circuit design, the method comprising the steps of:

storing a plurality of groups of one or more parallel arrays in a computer-readable medium, each group of one or more parallel arrays corresponding to a class of data items, wherein each data item within a class comprises one entry from each of the one or more parallel arrays within the class at the same index location across the one or more parallel arrays;

storing a master database header comprising a plurality of class pointers, each class pointer identifying the location of one of said groups of one or more parallel arrays; and storing a plurality of class data headers, one class data header for each group of one or more parallel arrays, each class data header comprising a pointer identifying the location of said master database header.

2. The method of claim 1, wherein each group of one or more parallel arrays corresponds to a component type used in an electronic circuit design.

3. The method of claim 1, further comprising the step of expanding the size of an existing class by storing an additional parallel array to one of the groups of one or more parallel arrays, said additional parallel array containing an entry for each existing data item in the group.

4. The method of claim 1, wherein each of said class data headers comprises an allocation field indicating a number of array entries that have been allocated, and a use field indicating a number of array entries that are currently in use for storing data items.

5. The method of claim 4, wherein each of said class data headers comprises an unused entry index field indicating the index of the first unused data item location in the group of one or more parallel arrays, and wherein each unused data item location in the group except for the last unused data item location stores a continuation index link identifying the next unused data item location in the group.

6. The method of claim 1, wherein a data association across groups of the one or more parallel arrays is carried out by storing in a location of a first array in a first group an index of an associated data item in the one or more parallel arrays of a second group, wherein the method further comprises the step of accessing said associated data item upon reading said location of the first array in the first group by using the pointer in the class data header of the first array to locate the master database header, using one of the class pointers in the master database header to locate said second group, and using the index of the associated item to locate the associated data item in the second group.

7. The method of claim 1, wherein at least one of the one or more arrays in at least one of said groups comprises an intelligent integer array.

8. The method of claim 7, wherein said intelligent integer array has a width corresponding to a number of bytes, and wherein said number of bytes is adaptively determined based on the size of stored data elements in said intelligent integer array.

9. The method of claim 8, further comprising the step of expanding the width of said intelligent integer array when a data element is too large to store in the intelligent integer array based upon its current width.

10. The method of claim 7, wherein said intelligent integer array comprises a header field for one or more corresponding data entries, the header field indicating the number of bytes for its corresponding data entry.

11. The method of claim 10, wherein said intelligent integer array stores shape objects used in routing a circuit design, each shape object being stored in an adaptively selected number of bytes depending upon its type.

12. The method of claim 7, wherein said intelligent integer array stores properties for another array in the groups of one or more parallel arrays.

13. The method of claim 1, wherein said plurality of groups of one or more parallel arrays, said master database header, and said plurality of class data headers are defined in an object-oriented computer language.

14. The method of claim 1, wherein said step of storing said plurality of groups of one or more parallel arrays on a computer-readable medium comprises the step of making a single operating system call to store each of the one or more parallel arrays in each group.

15. The method of claim 1, wherein data entries in at least one group of one or more parallel arrays comprise routing coordinates used in a circuit design, wherein the routing coordinates are normalized by coordinates of a fixed routing grid prior to being stored.

16. The method of claim 15, further comprising the steps of storing a set of header codes indicating that the stored routing coordinates are to be multiplied by the coordinates of the fixed routing grid when being read out.

17. The method of claim 16, wherein at least one array in said plurality of groups of one or more parallel arrays comprises From-To class of data items, wherein each data item is associated with a set of default assumptions and only deviations from the set of default assumptions are stored with the data item.

18. The method of claim 17, wherein said set of default assumptions include assumptions that a path starts at coordinates [0, 0], each layer starts at a defined first layer, no layer change occurs, no width change occurs, if a layer change occurs from a first layer to a second layer then a default via connects the first layer to the second layer, and if a layer change occurs then the new layer has a default width.

19. The method of claim 18, further comprising the step of reading out said at least one array comprising From-To class of data items to construct a vectored path of connectivity in the circuit design, wherein the construction of said vectored path of connectivity uses said set of default assumptions for each data item in the absence of deviations stored with the data item.

20. A computer-readable medium for storing data for access by an electronic design automation software tool being executed on a data processing system, the computer-readable medium including a data structure comprising:
a plurality of data objects, each data object comprising:
an allocation field indicating a number of array entries that have been allocated;
a use field indicating a number of array entries that are currently in use for storing data instances; and
a set of parallel arrays, wherein the set of parallel arrays has an internal relationship such that each parallel array has an equal number of storage locations and a set of elements taken from the parallel arrays at a common array index represents a record for a single data instance in the data object, the set of parallel arrays configured such that performing an operation taken from a set of data object operations does not alter the internal relationship, and wherein at least one of the parallel arrays is configured to store data entries comprising index values referencing at least one other array.

21. The computer-readable medium of claim 20, wherein the set of data object operations includes a creation operation for a new parallel array in the data object and a modification operation for changing a dimension of at least one of the parallel arrays in the data object, wherein the at least one other array resides in a separate data object, and wherein the data structure further comprises a master database header comprising a plurality of pointers to the plurality of data objects.

22. The computer-readable medium of claim 20, wherein at least one of the parallel arrays is configured to store data entries comprising delta values representing original data values modified by a base value to reduce storage requirements.

23. The computer-readable medium of claim 22, wherein the modification of the original data values comprises subtraction of the base value.

24. The computer-readable medium of claim 22, wherein the modification of the original data values comprises division by the base value.

25. The computer-readable medium of claim 20, wherein one of the data objects stores properties, another of the data objects stores owners, and the owner data object includes extra data bits available for storing bit-codes that identify common properties.

26. The computer-readable medium of claim 20, wherein the plurality of data objects are defined in an object-oriented computer language.

27. The computer-readable medium of claim 20, wherein the at least one other array resides in the same data object as the at least one of the parallel arrays configured to store index values, and wherein at least one of the parallel arrays is configured to store data entries comprising markers for first values in the parallel arrays of the same data object, thereby enabling creation of linked lists within the data object's arrays.

28. The computer-readable medium of claim 27, wherein the at least one other array has an associated set of predefined default assumptions such that only deviations from the set of predefined default assumptions are stored.

29. The computer-readable medium of claim 28, wherein the at least one other array stores bytestream encoded From-To data, and the set of predefined default assumptions comprise:
   a path starts at default coordinates;
   a path starts on a layer equal to a default element in a layer array;
   there are no layer changes unless otherwise indicated;
   there are no width changes unless otherwise indicated;
   when a layer change occurs, a default via is presumed unless otherwise indicated; and
   when a layer change occurs, a default width for the new layer is presumed unless otherwise indicated.

30. The computer-readable medium of claim 20, wherein at least one of the parallel arrays comprises an intelligent integer array such that storage locations defined by the intelligent integer array change their physical dimensions automatically based upon a maximum value entered into the intelligent integer array, the intelligent integer array utilizing a mode data value and a maximum data value for the intelligent integer array.

31. The computer-readable medium of claim 20, wherein the at least one other array comprises a bystream encoded array residing in the same data object as the at least one of the parallel arrays configured to store index values, and wherein the bytestream encoded array comprises an array of bytes organized such that a single data entry is stored using a minimum number of bytes needed to represent the single data entry, and a portion of each first byte, from a set of one or more bytes holding a single data entry, contains a header code indicating how many bytes make up the set of one or more bytes holding the single data entry.

32. The computer-readable medium of claim 31, wherein the header code is defined to correlate particular header code values to particular base values such that a bytestream encoded data entry comprises a delta value representing a data value modified by the base value identified by the particular header code value.

33. The computer-readable medium of claim 32, wherein the modification of the data value comprises subtraction of the base value.

34. The computer-readable medium of claim 32, wherein the modification of the data value comprises division by the base value.

35. The computer-readable medium of claim 32, wherein the base value comprises a coordinate for a fixed routing grid.

36. The computer-readable medium of claim 32, wherein the base value comrises the data value for a previous bytestream encoded data entry.

37. The computer-readable medium of claim 32, wherein the header code is further defined to correlate particular header code values to particular data values.

38. The computer-readable medium of claim 37, wherein the portion of each first byte consists of eight bits, and header code values above a maximum value represent a layer change to a layer equal to the header code value less the maximum value.

39. A data processing system executing an application program and containing a database used by the application program, the data processing system comprising:
   a processor for executing the application program; and
   a memory including a data structure accessible by the application program, the data structure comprising:
      a plurality of data objects, each data object comprising:
         an allocation field indicating a number of array entries that have been allocated;
         a use field indicating a number of array entries that are currently in use for storing data instances;
         a set of parallel arrays, wherein the set of parallel arrays has an internal relationship such that each parallel array has an equal number of storage locations and a set of elements taken from the parallel arrays at a common array index represents a record for a single data instance in the data object, the set of parallel arrays configured such that performing an operation taken from a set of data object operations does not alter the internal relationship, and wherein at least one of the parallel arrays is configured to store data entries comprising index values referencing at least one other array.

40. The data processing system of claim 39, wherein one of the data objects stores properties, another of the data objects stores owners, and the owner data object includes extra data bits available for storing bit-codes that identify common properties.

41. The data processing system of claim 39, wherein the at least one other array resides in the same data object as the at least one of the parallel arrays configured to store index values, and at least one of the parallel arrays is configured to store data entries comprising markers for first values in the parallel arrays of the same data object, thereby enabling creation of linked lists within the data object's arrays, and wherein the at least one other array has an associated set of predefined default assumptions such that only deviations from the set of predefined default assumptions are stored.

42. The data processing system of claim 39, wherein at least one of the parallel arrays comprises an intelligent integer array such that storage locations defined by the intelligent integer array change their physical dimensions automatically based upon a maximum value entered into the intelligent integer array, the intelligent integer array utilizing a mode data value and a maximum data value for the intelligent integer array.

43. The data processing system of claim 42, wherein the at least one other array comprises a bystream encoded array residing in the same data object as the at least one of the parallel arrays configured to store index values, and wherein the bytestream encoded array comprises an array of bytes organized such that a single data entry is stored using a minimum number of bytes needed to represent the single data entry, and a portion of each first byte, from a set of one or more bytes holding a single data entry, contains a header code indicating how many bytes make up the set of one or more bytes holding the single data entry.

44. The data processing system of claim 43, wherein the header code is defined to correlate particular header code values to particular data values and to particular base values such that some header codes represent data and other header codes represent a type of data and a modification operation, whereby performing the modification operation on a delta value designated by the header code, using the base value, results in an original value.

45. The data processing system of claim 44, wherein at least one of the parallel arrays is configured to store data entries comprising delta values representing original data values modified by a base value to reduce storage requirements.

46. The data processing system of claim 45, wherein a hierarchical tree structure is used to store cell names and net names.

47. The data processing system of claim 46, further comprising a control knob for selectively controlling memory saving techniques used by the data processing system, the memory saving techniques including use of hierarchical tree structures, use of delta values in place of original data values, and use of three-byte encoding and decoding for intelligent integer arrays.

48. The data processing system of claim 39, wherein the internal relationships for a plurality of the data objects are harmonized with each other, thereby enabling retrieval of multiple related data values from the multiple data objects using only a single cross-referencing index value for each parallel array.

49. In a data processing system executing an application program, wherein the application program accesses a data structure comprising information resident in a database, wherein the data structure resides in a memory of the data processing system and includes a plurality of data objects, each data object comprising a plurality of parallel arrays having an internal relationship such that each parallel array in the data object has an equal number of storage locations and a set of elements taken from the parallel arrays in the data object at a common array index represents a record for a single data item, a method of using the parallel arrays of a data object to store and retrieve data, comprising:

creating a new parallel array in the data object when a new data field is needed, the creating step being performed such that the internal relationship of the parallel arrays is not changed;

storing data in the data object using a first index number, the storing step automatically increasing the size of the parallel arrays when necessary to store the data, the storing step occurring without changing the internal relationship;

retrieving data by first-retrieving a second index value from a first parallel array in the data object using a first index number and second-retrieving the data from an array in another data object using the second index value as an index;

saving the data structure to a secondary storage;

loading the entire data structure from the secondary storage when the entire data structure is needed; and loading the data structure from the secondary storage incrementally when only a portion of the data structure is needed, wherein the incremental loading step is performed without reading in all records for a skipped data object.

50. The method of claim 49, further comprising retrieving a dynamically associated data value via the data object using the first index number when the dynamically associated data value is needed, the retrieving a dynamically associated data value step comprising:

accessing a second data object containing associated data values;

creating a temporary lookup table for finding a first associated data value for the data item in the data object, the creating step utilizing a bit field in the second data object that marks first associated data values, and the creating step utilizing a pre-counted number of data lists corresponding to the data stored in the data object; and using the temporary lookup table to retrieve the associated data value, if present.

51. The method of claim 50, wherein the retrieving a dynamically associated data value step further comprises first-checking extra bits in the data object, the extra bits configured to store data representing common instances of the second data object.

* * * * *

UNITED STATES PATENT AND TRADEMARK OFFICE
CERTIFICATE OF CORRECTION

PATENT NO. : 6,529,913 B1
DATED : March 4, 2003
INVENTOR(S) : Robert C Doig and Louis K Scheffer It is certified that error appears in the above-identified patent and that said Letters Patent is hereby corrected as shown below:

Column 21,
Line 66, please replace "comrises" with -- comprises --.

Signed and Sealed this

Eighteenth Day of November, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,529,913 B1
DATED         : March 4, 2003
INVENTOR(S)   : Robert C. Doig and Louis K. Scheffer It is certified that error appears in the above-identified patent and that said Letters Patent is hereby corrected as shown below:

Column 21,
Line 40, please replace "bystream" with -- bytestream --.

Column 22,
Line 56, please replace "bystream" with -- bytestream --.

Signed and Sealed this

Twenty-seventh Day of January, 2004

JON W. DUDAS
*Acting Director of the United States Patent and Trademark Office*